(12) United States Patent  
Chen et al.

(10) Patent No.: US 9,692,228 B2  
(45) Date of Patent: Jun. 27, 2017

(54) ESD PROTECTION CONTROL CIRCUIT AND SYSTEM

(71) Applicant: NOVATEK Microelectronics Corp., Hsin-Chu (TW)

(72) Inventors: Lu-An Chen, Hsinchu County (TW); Tung-Hao Sung, Hsinchu (TW); Kun-Jheng Wu, Hsinchu County (TW)

(73) Assignee: NOVATEK Microelectronics Corps., Hsin-Chu (TW)

( * ) Notice: Subject to any disclaimer, the term of this patent is extended or adjusted under 35 U.S.C. 154(b) by 51 days.

(21) Appl. No.: 14/746,826

(22) Filed: Jun. 22, 2015

(65) Prior Publication Data

US 2016/0372918 A1    Dec. 22, 2016

(51) Int. Cl.  
*H02H 9/04* (2006.01)

(52) U.S. Cl.  
CPC .................... *H02H 9/04* (2013.01)

(58) Field of Classification Search  
CPC .......... H02H 9/04; H02H 9/041; H02H 9/046  
USPC ......................................... 361/56  
See application file for complete search history.

(56) References Cited

U.S. PATENT DOCUMENTS

| | | | | |
|---|---|---|---|---|
| 6,573,778 | B2* | 6/2003 | Salome | H03K 17/0822 327/310 |
| 8,937,793 | B2* | 1/2015 | Hayano | H01L 27/0292 361/111 |
| 2010/0315748 | A1* | 12/2010 | Kwong | H03K 19/018557 361/56 |
| 2011/0122539 | A1* | 5/2011 | Mann | H03K 19/00315 361/91.5 |

FOREIGN PATENT DOCUMENTS

| | | |
|---|---|---|
| TW | 200921888 | 5/2009 |
| TW | 201414198 A | 4/2014 |
| TW | 201436458 A | 9/2014 |
| TW | 201519408 A | 5/2015 |

* cited by examiner

*Primary Examiner* — Dharti Patel  
(74) *Attorney, Agent, or Firm* — Winston Hsu

(57) ABSTRACT

An electrostatic discharge (ESD) protection control circuit for an output pad of an integrated circuit includes an output driver and a control switch. The output driver, coupled to the output pad, includes a first output transistor for outputting power or signals to the output pad. The control switch, for improving ESD protection on the output pad when closed, includes a first connection terminal, coupled to a gate terminal of the first output transistor; a second connection terminal, coupled to a ground terminal; and a control terminal, coupled to a first power supply terminal.

10 Claims, 9 Drawing Sheets

ESD PROTECTION CONTROL CIRCUIT AND SYSTEM

BACKGROUND OF THE INVENTION

1. Field of the Invention

The present invention relates to an electrostatic discharge (ESD) protection control circuit and system, and more particularly, to an ESD protection control circuit and system capable of improving ESD protection on an output pad of an integrated circuit.

2. Description of the Prior Art

With advancement in semiconductor process technology, the dimension of circuit elements shrinks to a submicron level, which increases performance and operation speed of integrated circuits (ICs). Reliability issues also become significant with decreasing element dimensions. Among these issues, electrostatic discharge (ESD) is one of the most important issues to be dealt with. Since the circuit elements in advanced processes have smaller dimensions, the ESD tolerance capability of the circuit elements becomes worse, while the quantity of environmental static electricity still remains. Therefore, the circuit elements may be damaged by ESD more easily.

There are two conventional circuit designs for ESD protection on an output pad. One is the self-protection method, and the other applies an external ESD protection cell to assist in ESD protection. Please refer to FIG. 1, which is a schematic diagram of a circuit structure of an output pad in an IC with self-protection. FIG. 1 illustrates an open drain circuit structure, which includes an output pad LX, an output transistor 100 and a previous stage 102. As the open drain circuit, the output transistor 100 is an N-type metal oxide semiconductor (NMOS) transistor with its drain terminal coupled to the output pad LX. The gate terminal of the output transistor 100 is coupled to the previous stage 102, for receiving control signals from the previous stage 102. The previous stage 102 includes an inverter 104 to output the control signals to drive the output transistor 100. In the circuit structure shown in FIG. 1, the output transistor 100 should follow a layout rule with higher ESD tolerance capability, where the distance from contact to poly may be larger and/or a salicide block (SAB) layer is disposed. In this manner, the output transistor 100 can bear higher ESD stress without additional ESD protection cells. However, the layout rule with higher ESD tolerance capability always requires a larger area and is thereby accompanied by poor performance. Especially when the output transistor 100 is a power transistor with a larger dimension, the layout area may increase much more in order to meet the layout rule for ESD protection.

Please refer to FIG. 2, which is a schematic diagram of a circuit structure of an output pad in an IC implemented with an external ESD protection cell 200. The circuit structure shown in FIG. 2 is similar to the circuit structure shown in FIG. 1, where the same circuit elements are denoted by the same symbols. The main difference thereof is that FIG. 2 further includes the ESD protection cell 200, which is connected to the output transistor 100 in parallel, for passing through ESD currents when the ESD currents are inputted from the output pad LX. However, there is a parasitic capacitance Cgd between the gate terminal and drain terminal of the output transistor 100. When an ESD voltage arrives at the output pad LX, the ESD voltage may be coupled to the gate terminal to turn on the output transistor 100 before the ESD protection cell 200 is turned on. If the layout of the output transistor 100 does not meet the rule for high ESD tolerance, the output transistor 100 may easily be burnt by ESD currents. Especially when the output transistor 100 is a power transistor with a larger dimension, the parasitic capacitance Cgd may be larger and thereby couple the ESD voltage signal to the gate terminal more easily.

As can be seen, the conventional ESD protection techniques are not satisfactory. Thus, there is a need to provide another circuit structure to achieve better ESD protection.

SUMMARY OF THE INVENTION

It is therefore an objective of the present invention to provide an electrostatic discharge (ESD) protection control circuit and system for an output pad of an integrated circuit (IC), to achieve satisfactory ESD protection without influencing normal operations of the IC.

The present invention discloses an ESD protection control circuit for an output pad of an IC. The ESD protection control circuit comprises an output driver and a control switch. The output driver, coupled to the output pad, comprises a first output transistor for outputting power or signals to the output pad. The control switch, for improving ESD protection on the output pad when closed, comprises a first connection terminal, coupled to a gate terminal of the first output transistor; a second connection terminal, coupled to a ground terminal; and a control terminal, coupled to a first power supply terminal.

The present invention further discloses an ESD protection system for an output pad of an IC. The ESD protection system comprises an output driver, a previous stage, an ESD protection cell and a control switch. The output driver, coupled to the output pad, comprises an output transistor for outputting power or signals to the output pad. The previous stage, coupled to the output driver, is used for receiving power from a power supply terminal. The ESD protection cell is coupled to the output pad. The control switch, for improving ESD protection on the output pad when closed, comprises a first connection terminal, coupled to a gate terminal of the first output transistor; a second connection terminal, coupled to a ground terminal; and a control terminal, coupled to the power supply terminal.

These and other objectives of the present invention will no doubt become obvious to those of ordinary skill in the art after reading the following detailed description of the preferred embodiment that is illustrated in the various figures and drawings.

DETAILED DESCRIPTION

Figure 3A:
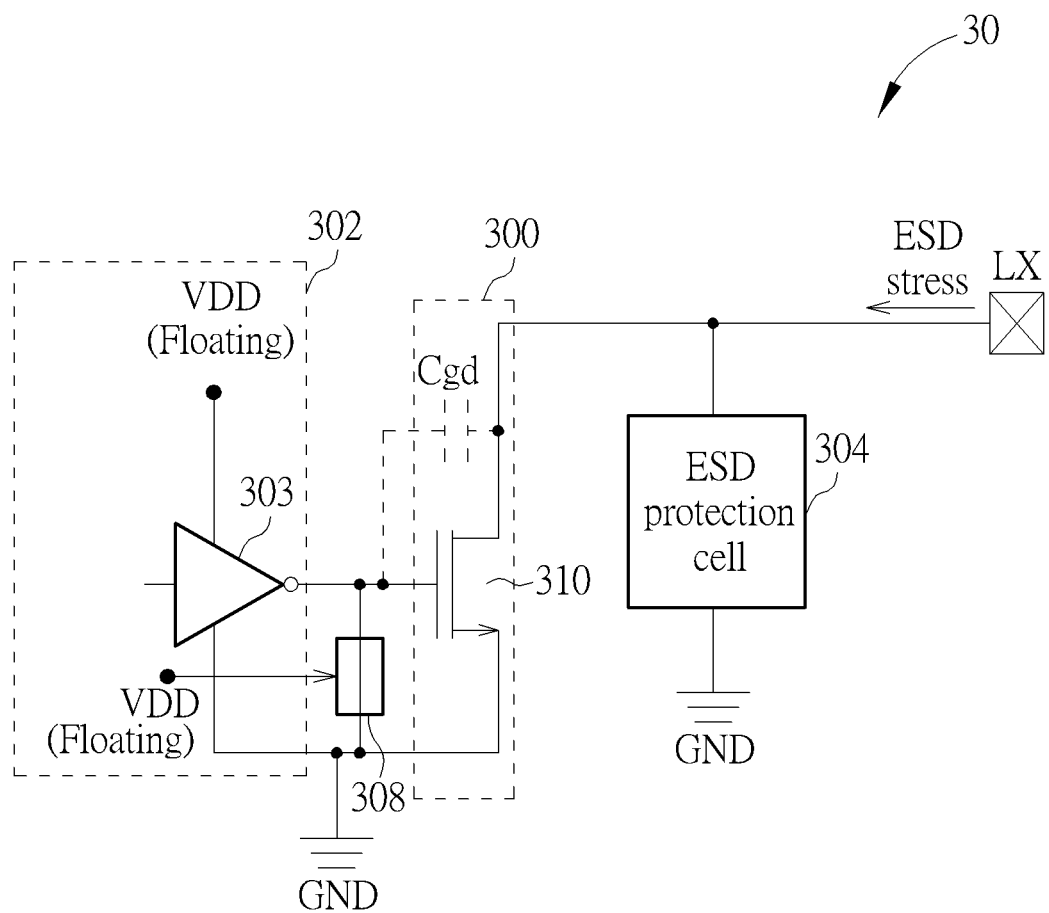
FIG. 3A and FIG. 3B are schematic diagrams of an electrostatic discharge (ESD) protection system according to an embodiment of the present invention.
Figure 3B:
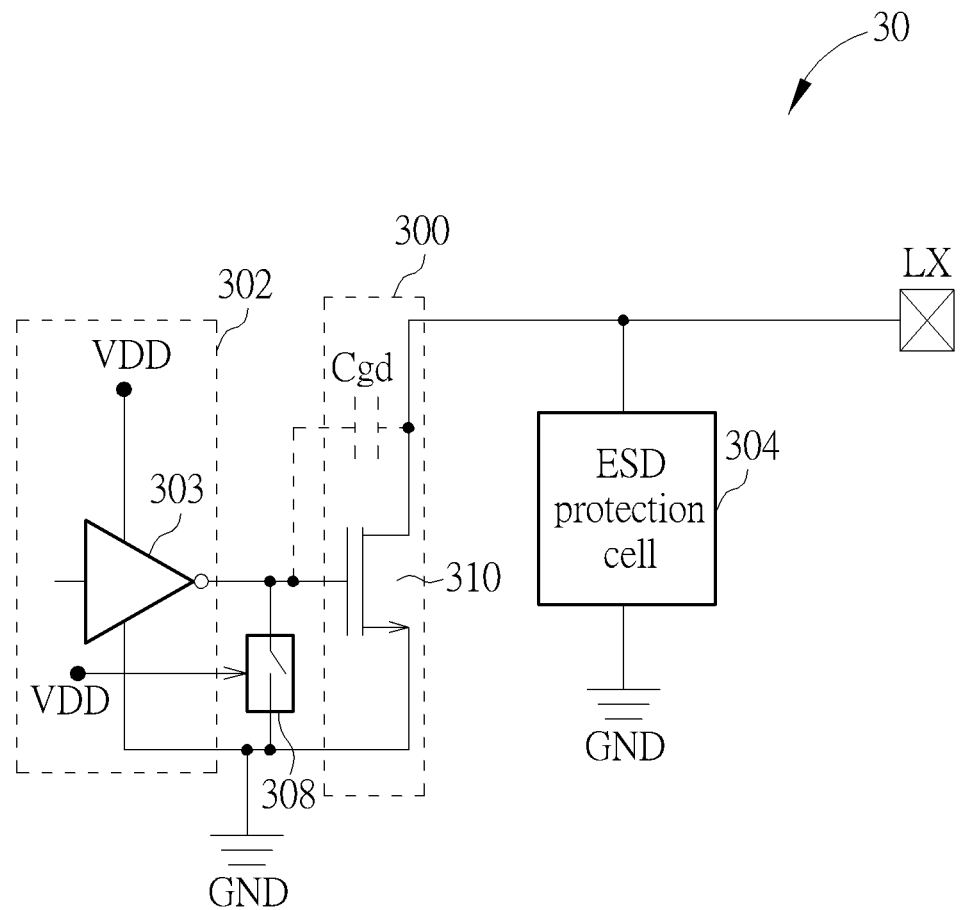

Please refer to FIG. 3A and FIG. 3B, which are schematic diagrams of an electrostatic discharge (ESD) protection system 30 according to an embodiment of the present invention. The ESD protection system 30 includes an output pad LX of an integrated circuit (IC), an output driver 300, a previous stage 302, an ESD protection cell 304 and a control switch 308. The output driver 300, coupled to the output pad LX, includes an output transistor 310 for outputting power or signals to the output pad LX. For example, if the output transistor 310 is a power transistor, the output transistor 310 will output power to the output pad LX. The previous stage 302, coupled to the output driver 300, receives power from a power supply terminal VDD and drives the output transistor 310 to output the power or signals. The previous stage 302 includes an inverter 303 to output control signals to drive the output transistor 310. The ESD protection cell 304, coupled to the output pad LX, is externally connected to the output transistor 310 in parallel, for receiving ESD currents when an ESD stress arrives at the output pad LX. The control switch 308 is used for improving ESD protection on the output pad LX when closed. As shown in FIGS. 3A and 3B, the first connection terminal of the control switch 308 is coupled to the gate terminal of the output transistor 310, the second connection terminal of the control switch 308 is coupled to the ground terminal GND, and the control terminal of the control switch 308 is coupled to the power supply terminal VDD.

Figure 1:
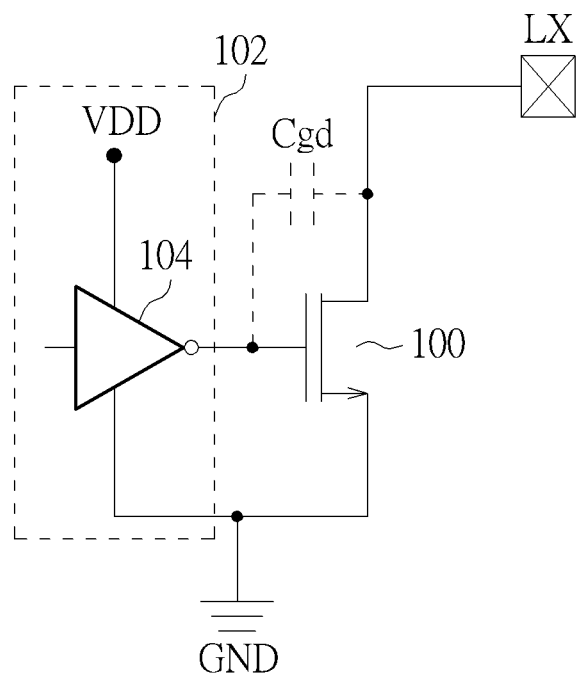
FIG. 1 is a schematic diagram of a circuit structure of an output pad in an IC with self-protection.
Figure 2:
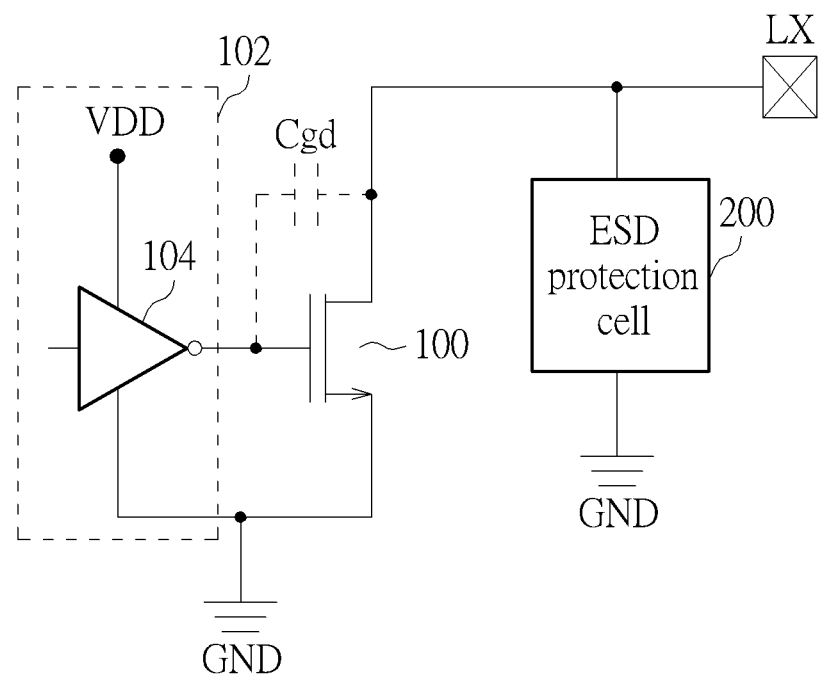
FIG. 2 is a schematic diagram of a circuit structure of an output pad in an IC implemented with an external ESD protection cell.

In detail, the control switch 308 is implemented as a control circuit for improving ESD protection for the output pad; that is, the control switch 308 prevents the output transistor 310 from being turned on due to coupling of the parasitic capacitance Cgd of the output transistor 310 when the ESD stress arrives, and thereby solves the problems described in FIG. 2. More specifically, the output transistor 310 is an N-type metal oxide semiconductor (NMOS) transistor and the control switch 308 is controlled by the power supply terminal VDD which supplies power to the previous stage 302 or further to other components in the IC. In such a condition, when the IC is power-off, the power supply terminal VDD is floating and controls the control switch 308 to be closed, which pulls the gate voltage of the output transistor 310 to zero and thereby prevents the output transistor 310 from being turned on, as shown in FIG. 3A. When the IC is power-on, the power supply terminal VDD may control the control switch 308 to be open, to prevent the control switch 308 from influencing functions of the output transistor 310 under normal operations, as shown in FIG. 3B. Detailed operation principles of the ESD protection control circuit are illustrated in Table 1:

TABLE 1

|  | VDD | Control switch 308 | Output transistor 310 |
|---|---|---|---|
| Normal operations | Power-on | Open | Normal operations |
| ESD stress | Power-off | Closed | Turned-off |

Figure 4:
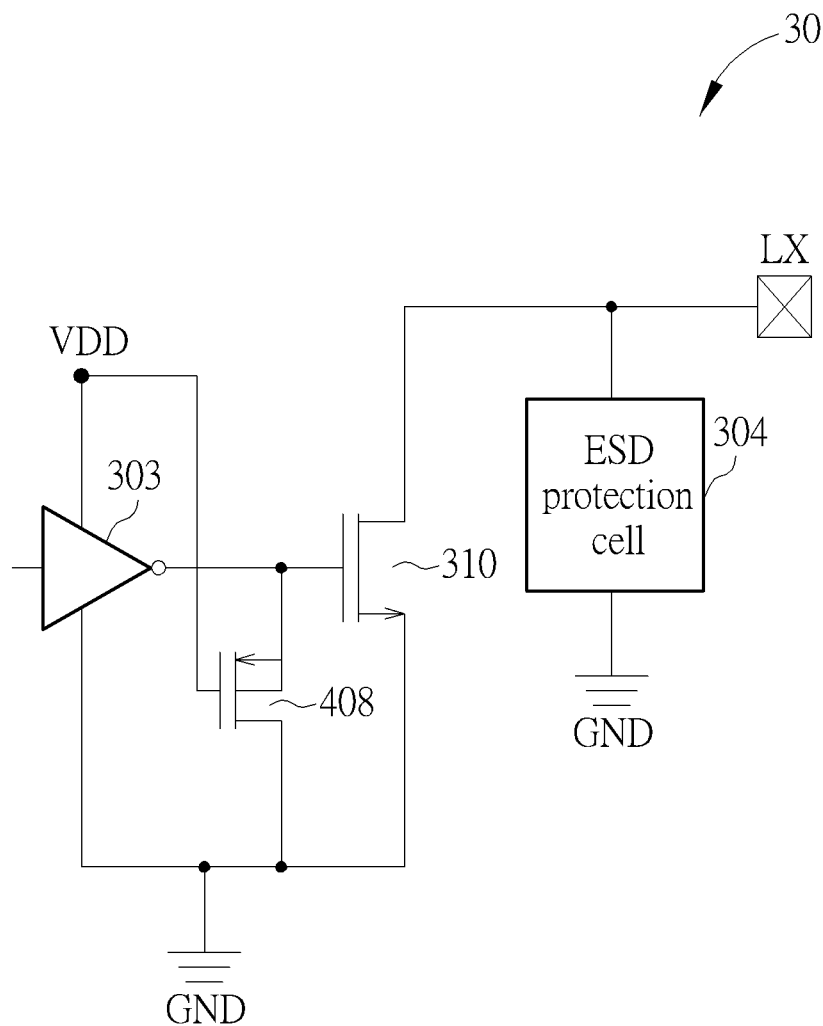
FIG. 4 is a schematic diagram of an implementation of the ESD protection system.

In an embodiment, the control switch 308 may be implemented with a P-type metal oxide semiconductor (PMOS) transistor. Please refer to FIG. 4, which is a schematic diagram of an implementation of the ESD protection system 30. The circuit structure shown in FIG. 4 is similar to the circuit structure shown in FIGS. 3A and 3B, where the same circuit elements are denoted by the same symbols. As shown in FIG. 4, the control switch 308 is implemented with a PMOS transistor 408, of which the source terminal is connected to the gate terminal of the output transistor 310, the drain terminal is connected to the ground terminal GND, and the gate terminal is connected to the power supply terminal VDD, so that the power supply terminal VDD may control the operations of the PMOS transistor 408. The bulk terminal of the PMOS transistor 408 may be connected to the power supply terminal VDD or the gate terminal of the output transistor 310. As a result, the control switch 308 may simply be implemented with only one PMOS transistor; that is, only one PMOS transistor is enough to effectively improve the ESD tolerance capability of the output pad.

In detail, when the IC is power-off, the power supply terminal VDD is floating and turns on the PMOS transistor 408, which further pulls the gate voltage of the output transistor 310 to zero and thereby prevents the output transistor 310 from being turned on due to coupling of the parasitic capacitance Cgd of the output transistor 310 when the ESD stress arrives. On the other hand, when the IC is power-on, the power supply terminal VDD reaches a higher voltage level and turns off the PMOS transistor 408, to prevent the PMOS transistor 408 from influencing functions of the output transistor 310 under normal operations. Detailed operation principles of the ESD protection control circuit with the PMOS transistor 408 are illustrated in Table 2:

TABLE 2

|  | VDD | PMOS transistor 408 | Output transistor 310 |
|---|---|---|---|
| Normal operations | Power-on | Turned-off | Normal operations |
| ESD stress | Power-off | Turned-on | Turned-off |

In another embodiment, the control switch 308 may be implemented with an NMOS transistor, of which the drain terminal is connected to the gate terminal of the first output transistor 310, the source terminal is connected to the ground terminal GND, and the gate terminal is coupled to the power supply terminal VDD via an inverter, so that the power supply terminal VDD may control the operations of the NMOS transistor via the inverter.

Please note that the present invention provides an ESD protection control circuit and system capable of improving ESD protection on an output pad of an IC. Those skilled in the art can make modifications and alternations accordingly. For example, the output transistor may be used for outputting signals or power. If the output transistor outputs power, it may be a power supply transistor, and the output pad may be a power output pad. Note that the ESD protection control circuit is more applicable to power supply transistors, since the power supply transistors may have a larger dimension and easily suffer from the parasitic capacitance Cgd coupling the ESD voltage to the gate terminal to turn on the power supply transistors, but should not be limited herein. In addition, in the above embodiments, the ESD protection control circuit is applied to open drain circuit structures, but in other embodiments, other circuit structures may also be incorporated with the ESD protection control circuit.

Figure 5A:
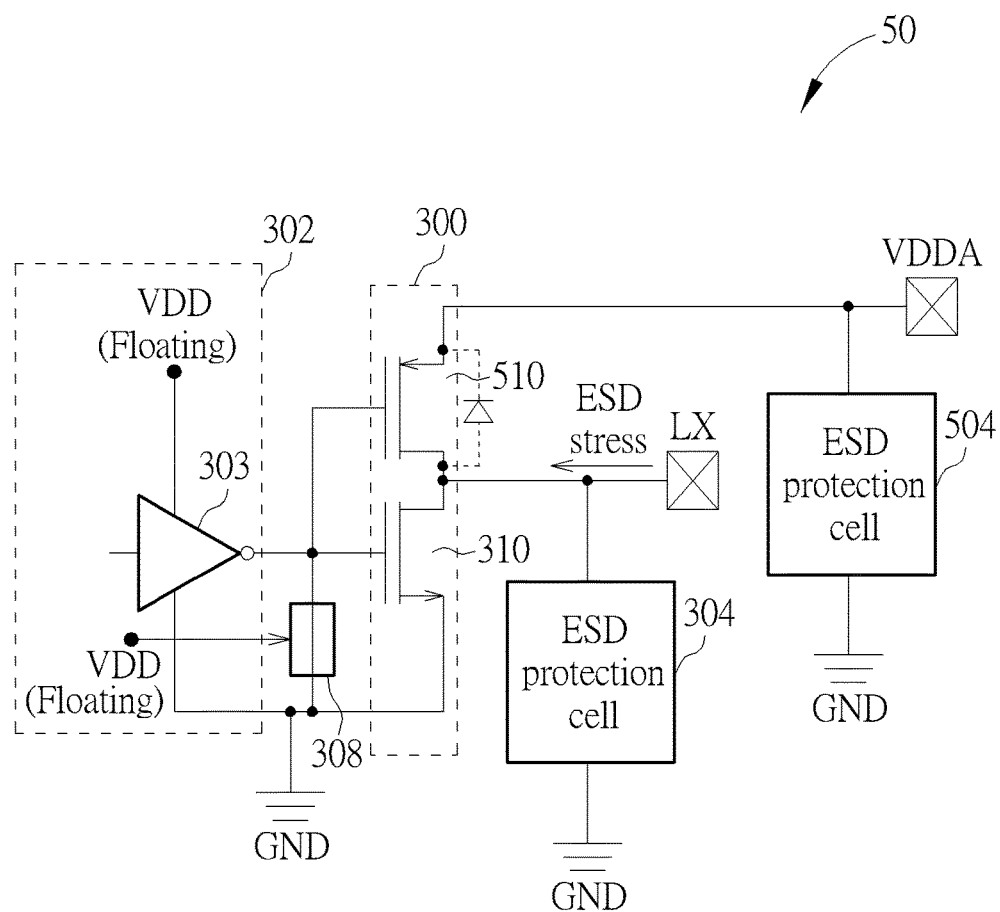
FIG. 5A and FIG. 5B are schematic diagrams of another ESD protection system according to an embodiment of the present invention.
Figure 5B:
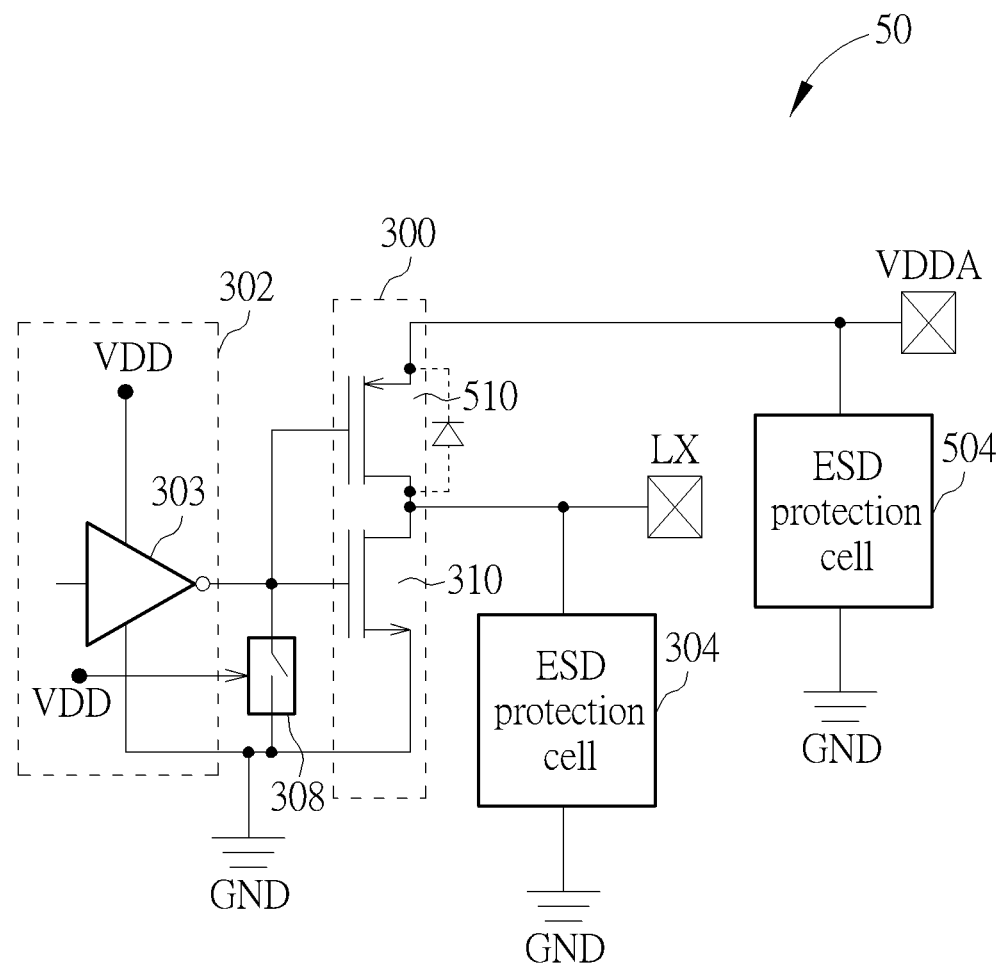

For example, please refer to FIG. 5A and FIG. 5B, which are schematic diagrams of another ESD protection system 50 according to an embodiment of the present invention. The ESD protection system 50 shown in FIGS. 5A and 5B is similar to the ESD protection system 30 shown in FIGS. 3A and 3B, where the same circuit elements are denoted by the same symbols. The main difference between the ESD protection system 50 and the ESD protection system 30 is that, the output driver 300 of the ESD protection system 50 further includes a PMOS transistor 510, where the PMOS transistor 510 and the NMOS transistor 310 cooperate to output signals or power to the output pad LX. Further, the PMOS transistor 510 receives power from another power supply terminal VDDA, which is different from the power supply terminal VDD supplying power to the previous stage 302. The power supply terminal VDDA is also connected to an ESD protection cell 504.

In detail, as shown in FIG. 5A, when the IC is power-off, the power supply terminal VDD is floating and controls the control switch 308 to be closed, which pulls the gate voltage of the output transistors 310 and 510 to zero and thereby prevents the output transistor 310 from being turned on due to coupling of the parasitic capacitance Cgd of the output transistor 310 when the ESD stress arrives. The output transistor 510 is turned on since it is a PMOS transistor. In such a condition, when ESD stress arrives at the output pad LX, several ESD currents may flow through the ESD protection cell 304 to the ground terminal GND, and other ESD currents may flow through the PMOS transistor 510, the ESD protection cell 504, and then to the ground terminal GND. Note that a general MOS transistor possesses a parasitic diode, and the ESD currents may flow in forward bias condition in the parasitic diode of the output transistor 510, as shown in FIGS. 5A and 5B. Therefore, the output transistor 510 will not be burnt with currents flowing in forward bias, and these currents may flow to the ground terminal GND via the ESD protection cell 504.

On the other hand, as shown in FIG. 5B, when the IC is power-on, the power supply terminal VDD controls the control switch 308 to be open. Since the control switch 308 is open, it may not influence functions of the output transistors 310 and 510 under normal operations.

Figure 6A:
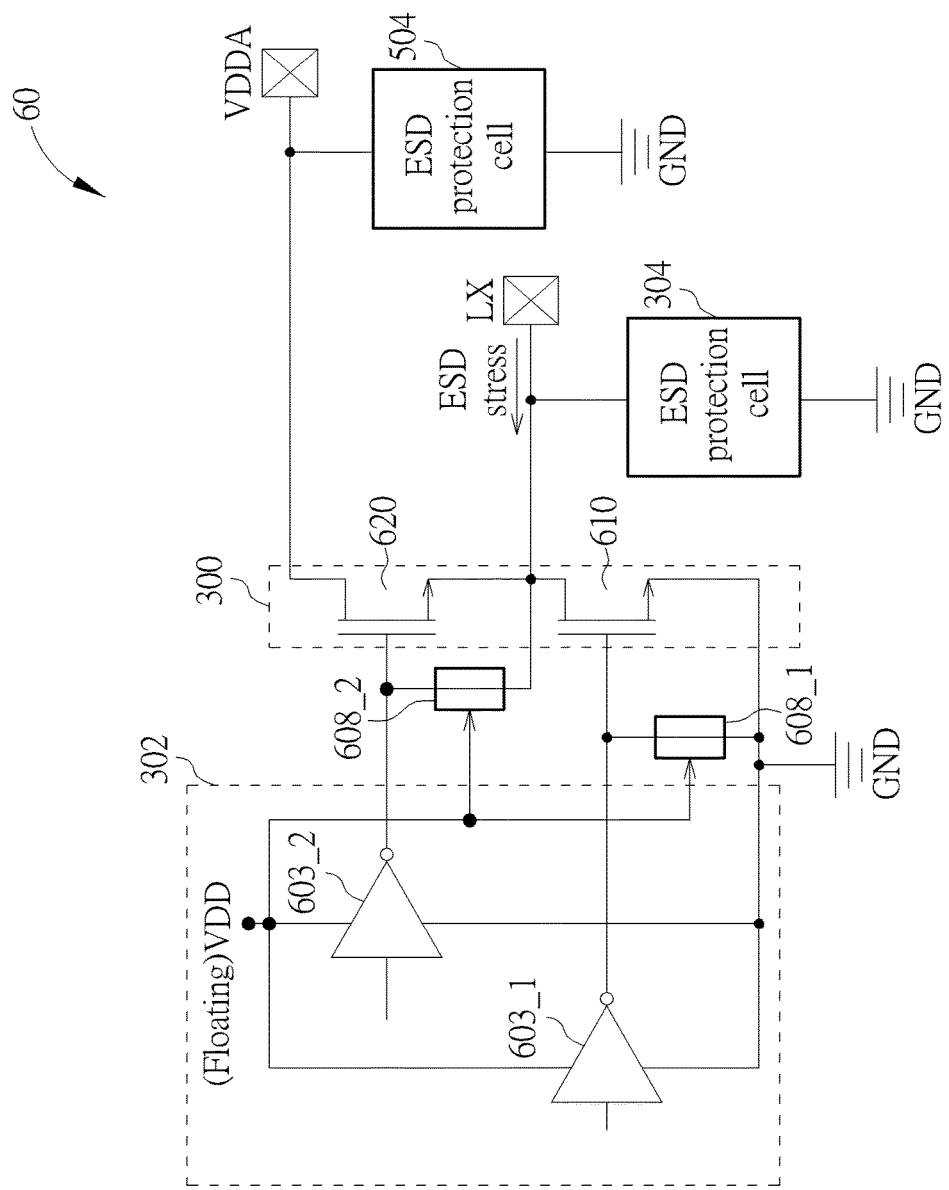
FIG. 6A and FIG. 6B are schematic diagrams of a further ESD protection system according to an embodiment of the present invention.
Figure 6B:
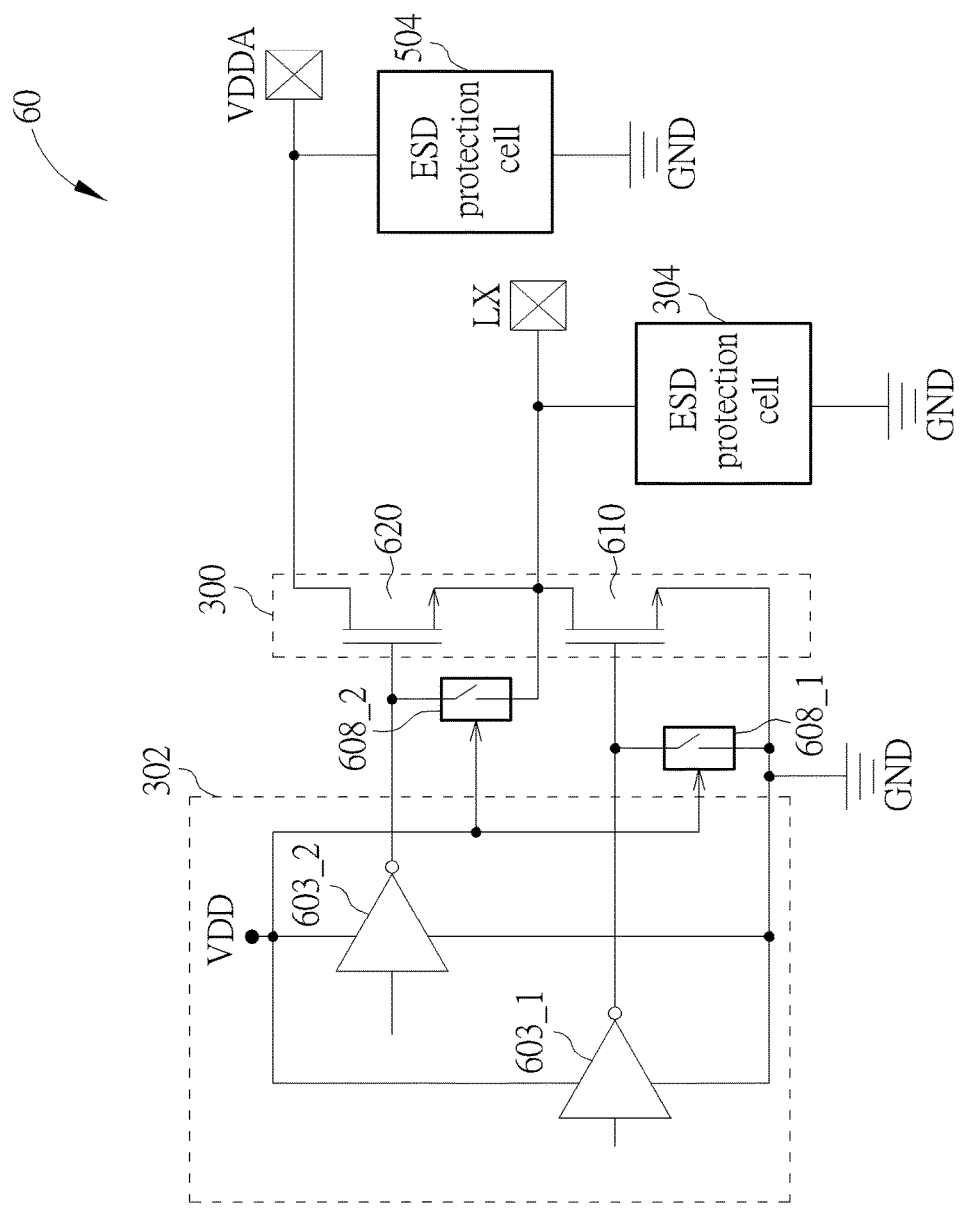

Please refer to FIG. 6A and FIG. 6B, which are schematic diagrams of a further ESD protection system 60 according to an embodiment of the present invention. The ESD protection system 60 shown in FIGS. 6A and 6B is similar to the ESD protection system 50 shown in FIGS. 5A and 5B, where the same circuit elements are denoted by the same symbols. The main difference between the ESD protection system 60 and the ESD protection system 50 is that, the output driver 300 of the ESD protection system 60 includes two NMOS output transistors 610 and 620, which are respectively driven by inverters 603_1 and 603_2 in the previous stage 302. Therefore, two control switches 608_1 and 608_2 are required, wherein the control switch 608_1 is used for controlling the output transistor 610, and the control switch 608_2 is used for controlling the output transistor 620.

In detail, as shown in FIG. 6A, when the IC is power-off, the power supply terminal VDD is floating and controls the control switches 608_1 and 608_2 to be closed. In such a condition, the gate voltage of the output transistor 610 is pulled to zero to turn off the output transistor 610, and the gate voltage of the output transistor 620 is pulled to be equal to the source voltage of the output transistor 620, which also prevents the output transistor 620 to be turned on (since its gate-to-source voltage keeps on zero when the control switch 608_2 is closed). As a result, both of the output transistors 610 and 620 are not turned on, so the ESD currents from the output pad LX will flow through the ESD protection cell 304.

On the other hand, as shown in FIG. 6B, when the IC is power-on, the power supply terminal VDD controls the control switches 608_1 and 608_2 to be open. Since the control switches 608_1 and 608_2 are open, they may not influence functions of the output transistors 610 and 620 under normal operations.

Please note that, in the ESD protection systems 50 and 60, the output driver 300 receives power from the power supply terminal VDDA, which is different from the power supply terminal VDD supplying power to the previous stage 302. Inmost high output voltage circuit systems, a higher output voltage is driven by previous stages with a lower supply voltage. Therefore, in the ESD protection systems 50 and 60, the power supply terminal VDDA may supply a higher voltage (e.g., 30V) for output requirements, while the power supply terminal VDD may supply a lower voltage (e.g., 5V) to the previous stages for higher operational speed and lower power consumption. Note that the implementations of the ESD protection systems of the present invention may not be feasible when the control switch is controlled by a power supply terminal supplying power to the output driver, i.e., the power supply terminal VDD and the power supply terminal VDDA are the same. This is because the ESD voltage may pass on to the power supply terminal of the output driver, to turn off the transistor (e.g., the PMOS transistor 408) in the control switch when ESD stress arrives.

As can be seen, the ESD protection control circuits and systems of the present invention are capable of improving ESD capability of an output pad. This effect is verified in a 0.18 μm Bipolar-CMOS-DMOS (BCD) process. For example, an output pad and an output driver implemented with a first ESD protection cell have ESD performance of less than 2 kV in human body mode (HBM) and less than 200V in machine mode (MM). When a control switch (e.g., a PMOS transistor) is included to control the gate terminal of the output driver, the ESD performance becomes 3 kV in HBM and 250V in MM. In another example, the same output pad and output driver implemented with a second ESC protection cell have ESD performance of 8 kV in HBM and 200V in MM. When a control switch (e.g., a PMOS transistor) is included to control the gate terminal of the output driver, the ESD performance becomes 8 kV in HBM and 500V in MM. The verification results show that the ESD protection control circuits and systems of the present invention allow a useless ESD protection cell to be useful. For an ESD protection cell with enough performance, the present invention may further enhance its performance to achieve better ESD tolerance capability.

To sum up, the present invention provides an ESD protection control circuit and system for an output pad of an IC. A control switch such as a PMOS transistor is coupled between the gate terminal of an output transistor coupled to the output pad and a power supply terminal, so that the power supply terminal may turn off the output transistor when the IC is power-off, in order to prevent the output transistor from being turned on due to coupling of the parasitic capacitance Cgd of the output transistor when the ESD stress arrives; hence, the ESD currents inputted from the output pad may flow through the ESD protection cell rather than the output transistor. As a result, the embodiments of the present invention may improve the ESD tolerance capability of the output pad.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection control circuit for an output pad of an integrated circuit (IC), the ESD protection control circuit comprising:

an output driver, coupled to the output pad, comprising a first output transistor for outputting power or signals to the output pad; and a control switch, for improving ESD protection on the output pad, comprising:
- a first connection terminal, coupled to a gate terminal of the first output transistor;
- a second connection terminal, coupled to a ground terminal; and
- a control terminal, electrically connected to a first power supply terminal;

wherein the control switch comprises a P-type metal oxide semiconductor transistor.

2. The ESD protection control circuit of claim 1, wherein the P-type metal oxide semiconductor transistor comprises:
- a source terminal, connected to the gate terminal of the first output transistor;
- a drain terminal, connected to the ground terminal; and
- a gate terminal, connected to the first power supply terminal.

3. The ESD protection control circuit of claim 1, wherein the control switch comprises an N-type metal oxide semiconductor transistor, which comprises:
- a drain terminal, connected to the gate terminal of the first output transistor;
- a source terminal, connected to the ground terminal; and
- a gate terminal, coupled to the first power supply terminal via an inverter.

4. The ESD protection control circuit of claim 1, wherein the first output transistor is an N-type metal oxide semiconductor transistor, and the first power supply terminal controls the control switch to be closed when the IC is power-off and controls the control switch to be open when the IC is power-on.

5. The ESD protection control circuit of claim 1, wherein the first power supply terminal supplies power to a previous stage coupled to the output driver.

6. The ESD protection control circuit of claim 1, wherein the output pad is connected to an ESD protection cell.

7. The ESD protection control circuit of claim 1, wherein the output driver further comprises a second output transistor, which receives power from a second power supply terminal.

8. The ESD protection control circuit of claim 7, wherein the second power supply terminal is connected to an ESD protection cell.

9. The ESD protection control circuit of claim 1, wherein the first output transistor is a power supply transistor, and the output pad is a power output pad.

10. An electrostatic discharge (ESD) protection system for an output pad of an integrated circuit (IC), the ESD protection system comprising:

an output driver, coupled to the output pad, comprising an output transistor for outputting power or signals to the output pad;

a previous stage, coupled to the output driver, for receiving power from a power supply terminal;

an ESD protection cell, coupled to the output pad; and a control switch, for improving ESD protection on the output pad, comprising:
- a first connection terminal, coupled to a gate terminal of the first output transistor;
- a second connection terminal, coupled to a ground terminal; and
- a control terminal, electrically connected to the power supply terminal;

wherein the control switch comprises a P-type metal oxide semiconductor transistor.

* * * * *

UNITED STATES PATENT AND TRADEMARK OFFICE
CERTIFICATE OF CORRECTION

PATENT NO. : 9,692,228 B2  Page 1 of 1
APPLICATION NO. : 14/746826
DATED : June 27, 2017
INVENTOR(S) : Lu-An Chen et al.

It is certified that error appears in the above-identified patent and that said Letters Patent is hereby corrected as shown below:

On the Title Page

Item (73), correct the name of the assignee from "NOVATEK Microelectronics Corps." to --NOVATEK Microelectronics Corp.--.

Signed and Sealed this
Third Day of October, 2017

Joseph Matal
*Performing the Functions and Duties of the
Under Secretary of Commerce for Intellectual Property and
Director of the United States Patent and Trademark Office*